(12) United States Patent
Singh

(10) Patent No.: US 7,499,352 B2
(45) Date of Patent: Mar. 3, 2009

(54) INTEGRATED CIRCUIT HAVING MEMORY ARRAY INCLUDING ROW REDUNDANCY, AND METHOD OF PROGRAMMING, CONTROLLING AND/OR OPERATING SAME

(75) Inventor: Anant Pratap Singh, Portland, OR (US)

(73) Assignee: Innovative Silicon ISi SA, Lausanne (CH)

( * ) Notice: Subject to any disclaimer, the term of this patent is extended or adjusted under 35 U.S.C. 154(b) by 0 days.

(21) Appl. No.: 11/804,098

(22) Filed: May 17, 2007

(65) Prior Publication Data

US 2007/0268761 A1 Nov. 22, 2007

Related U.S. Application Data

(60) Provisional application No. 60/801,809, filed on May 19, 2006.

(51) Int. Cl.
*G11C 7/00* (2006.01)
(52) U.S. Cl. ............... 365/200; 365/225.7; 365/230.06; 365/230.01
(58) Field of Classification Search ......... 365/200, 365/225.7, 230.06, 230.01
See application file for complete search history.

(56) References Cited

U.S. PATENT DOCUMENTS

| | | | | |
|---|---|---|---|---|
| 5,276,360 A | * | 1/1994 | Fujima | 326/10 |
| 5,295,114 A | * | 3/1994 | Kobayashi | 365/230.06 |
| 5,349,556 A | * | 9/1994 | Lee | 365/200 |
| 5,465,234 A | * | 11/1995 | Hannai | 365/200 |
| 5,515,383 A | | 5/1996 | Katoozi | |
| 5,544,106 A | * | 8/1996 | Koike | 365/200 |
| 5,742,556 A | * | 4/1998 | Tavrow et al. | 365/225.7 |
| 5,959,906 A | * | 9/1999 | Song et al. | 365/200 |
| 6,058,053 A | * | 5/2000 | Tsuji et al. | 365/200 |
| 6,084,887 A | * | 7/2000 | Salisbury et al. | 370/467 |
| 6,262,935 B1 | | 7/2001 | Parris et al. | |
| 6,411,556 B1 | * | 6/2002 | Amano | 365/200 |
| 6,498,756 B2 | * | 12/2002 | Lee | 365/200 |

(Continued)

OTHER PUBLICATIONS

"A 30-ns 64-MB DRAM with Built-in Self-Test and Self-Repair Function", Tanabe et al., IEEE Journal of Sold-State Circuits, vol. 27, No. 11, Nov. 1992, pp. 1525-1533.

*Primary Examiner*—Viet Q Nguyen
(74) *Attorney, Agent, or Firm*—Neil A. Steinberg

(57) ABSTRACT

An integrated circuit device (for example, a logic device (such as, a microcontroller or microprocessor) or a portion of a memory device (such as, a discrete memory)), including (a) a memory cell array having a plurality of memory cells arranged in (i) a plurality of normal rows of memory cells which are associated with and selectable via normal row addresses and (ii) a redundant row of memory cells which is associated with and selectable via a redundant row address, (b) address decoder circuitry to generate decoded row address data in response to an applied row address, (c) a memory to store decoded redundant row address data, (d) normal word line drivers, (e) redundant word line drivers, and (f) redundancy address evaluation circuitry to (i) store decoded redundant row address data which corresponds to the redundant row address, and (ii) in operation, determine whether the decoded row address data corresponds to the decoded redundant row address data, and, in response thereto, to enable the redundant word line drivers. In another aspect, the present inventions are directed to such row redundancy circuitry.

22 Claims, 12 Drawing Sheets

U.S. PATENT DOCUMENTS

| | | | |
|---|---|---|---|
| 6,707,734 B2 * | 3/2004 | Demone | 365/200 |
| 6,912,150 B2 | 6/2005 | Portmann et al. | |
| 6,969,662 B2 | 11/2005 | Fazan et al. | |
| 7,085,153 B2 | 8/2006 | Ferrant et al. | |
| 7,085,156 B2 | 8/2006 | Ferrant et al. | |
| 7,359,242 B2 * | 4/2008 | Kim | 365/185.09 |
| 2005/0063224 A1 | 3/2005 | Fazan et al. | |
| 2006/0126374 A1 | 6/2006 | Waller et al. | |
| 2006/0131650 A1 | 6/2006 | Okhonin et al. | |
| 2007/0023833 A1 | 2/2007 | Okhonin et al. | |
| 2007/0058427 A1 | 3/2007 | Okhonin et al. | |
| 2007/0064489 A1 | 3/2007 | Bauser | |
| 2007/0085140 A1 | 4/2007 | Bassin | |
| 2007/0097751 A1 | 5/2007 | Popoff et al. | |
| 2007/0138530 A1 | 6/2007 | Okhonin | |

* cited by examiner

INTEGRATED CIRCUIT HAVING MEMORY ARRAY INCLUDING ROW REDUNDANCY, AND METHOD OF PROGRAMMING, CONTROLLING AND/OR OPERATING SAME

RELATED APPLICATION

This application claims priority to U.S. Provisional Application Ser. No. 60/801,809, entitled "Integrated Circuit Having Memory Array Including Row Redundancy, and Method of Programming, Controlling and/or Operating Same", filed May 19, 2006; the contents of this provisional application are incorporated by reference herein in their entirety.

BACKGROUND

The inventions described and illustrated herein relate to an integrated circuit device having a memory cell array including row redundancy, and techniques for programming, configuring, controlling and/or operating such device; and more particularly, in one aspect, to an integrated circuit having random access memory ("RAM") array having a plurality of memory cells (for example, memory cells having an electrically floating body in which an electrical charge is stored) arranged in a matrix of rows and columns wherein the integrated circuit includes a row redundancy architecture including at least one redundant row to substitute or replace a row of memory cells having at least one defective memory cell.

Briefly, with reference to FIG. 1A, memory cell array 10 typically includes a plurality of memory cells 12 arranged in a matrix of rows 14 (each typically having a common word line 16) and columns 18. A row address decoder 20 enables one or more rows to be read by sensing circuitry 22 (for example, a plurality of sense amplifiers). In order to improve, enhance and/or maintain a predetermined manufacturing yield of a memory cell array 10 and/or device, redundant rows 14r are often incorporated into memory array 10 to logically "replace" one or more rows 14 having one or more defective memory cells 12.

With reference to FIG. 1B, in one conventional technique, row redundancy is implemented by including a redundant address decoder 20r which is programmed or mapped to logically replace a defective row (i.e., a row of memory cells having one or more defective memory cells) with spare, replacement, redundant or another row 14r of memory cells 12r in memory array 10 (i.e., redundant row 14r of memory cells 12r). The individual address comparators (not illustrated) of redundant row decoder 20r are programmed to "enable" spare or redundant word line drivers 24r when the "applied" address matches the address of the defective row (which is fixed/stored in redundant row address decoder 20r). In regard, the addresses of the defective word lines 16 (which define defective row 14 of memory cells 12) are programmed into address comparators of redundant row decoder 20r during wafer testing. In this way, the redundant row address comparators enable a spare or redundant word line (which define the redundant row 14r memory cells 12) to be active when a set of row address signals match the address of a defective row 14 (or word line 16) which is programmed into redundant row address decoder 20r.

With reference to FIG. 1C, in one conventional technique, redundant row decoder 20r is programmed via configuring the state of a set of fuses 26. In this regard, spare or redundant rows are programmed by selectively "blowing" fuses 26 within redundant row decoder 20r to "match" or correspond to the address of the rows having defective memory cells. Such fuses are often programmed prior to packaging, during the wafer testing stage, or immediately after packaging, during the device testing stage. In this way, spare or redundant word line drivers 24r are enabled when the address matches the address programmed into redundant row decoder 20r.

Notably, circuitry 28 is implemented in memory array 10 to disable row 14 having the defective memory cells when the address matches the address programmed into redundant row decoder 20r, and spare or redundant word line drivers 24r are enabled. As such, in response to a "match" between the applied or incoming row address and the address programmed in redundant row decoder 20r, normal word line drivers 24 are disabled and redundant word line drivers 24r are enabled.

SUMMARY OF INVENTIONS

There are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, many of those permutations and combinations will not be discussed separately herein.

In a first principle aspect, the present inventions are directed to an integrated circuit device (for example, logic device or discrete memory device) comprising a memory cell array having a plurality of memory cells arranged in a matrix of rows and columns including (i) a plurality of normal rows of memory cells which are associated with and selectable via normal row addresses and (ii) a redundant row of memory cells which is associated with and selectable via a redundant row address. The integrated circuit device further includes address decoder circuitry to generate decoded row address data in response to an applied row address, normal word line drivers, coupled to the address decoder circuitry and the plurality of normal rows of memory cells, to responsively enable one or more normal rows of memory cells using the decoded row address data, and redundant word line drivers, coupled to the address decoder circuitry and the redundant row of memory cells, to responsively enable the redundant row of memory cells using the decoded row address data. In addition, the integrated circuit device of this aspect includes redundancy address evaluation circuitry, coupled to the address decoder circuitry, the normal word line drivers and the redundant word line drivers, to (i) store decoded redundant row address data which corresponds to the redundant row address, and (ii) in operation, determine whether the decoded row address data corresponds to the decoded redundant row address data, and, in response thereto, to enable the redundant word line drivers.

The redundancy address evaluation circuitry may include a memory to temporarily store the decoded redundant row address data. In this embodiment, the redundancy address evaluation circuitry may also include a comparator logic circuitry to compare the decoded row address data and the decoded redundant row address data which is temporarily stored in the memory and, in response to a match, to enable the redundant word line drivers and disable the normal word line drivers. In one embodiment, the memory, in response to a control signal, stores the decoded redundant row address data provided by the address decoder circuitry. In another embodiment, the memory, in response to a control signal, stores the decoded redundant row address data generated by the address decoder circuitry.

The memory may permanently store the decoded redundant row address data. In this embodiment, the redundancy address evaluation circuitry may include a comparator logic circuitry to compare the decoded row address data and the decoded redundant row address data which is stored in the memory and, in response to a match, to enable the redundant word line drivers and disable the normal word line drivers. In one embodiment, the memory, in response to a control signal, stores the decoded redundant row address data provided by the address decoder circuitry. In another embodiment, the memory, in response to a control signal, stores the decoded redundant row address data generated by the address decoder circuitry.

The integrated circuit device may also include controller circuitry, coupled to the address decoder circuitry and the redundancy address evaluation circuitry, to generate and/or determine (i) the redundant row address and (ii) the control signal, wherein in response thereto, the address decoder circuitry generates decoded redundant row address data and the redundancy address evaluation circuitry stores the decoded redundant row address data.

The controller circuitry may determine the redundant row address based on detecting one or more bit failures or anticipated bit failures of memory cells of a row of memory cells of the plurality of normal rows of memory cells. In one embodiment, the controller circuitry generates (i) the redundant row address and (ii) the control signal, wherein in response thereto, the address decoder circuitry generates decoded redundant row address data and the redundancy address evaluation circuitry stores the decoded redundant row address data.

In another principle aspect, the present inventions are directed to a method of programming a redundant row of memory cells into an integrated circuit device, the integrated circuit device includes (a) a memory cell array having a plurality of memory cells arranged in a matrix of rows and columns including (i) a plurality of normal rows of memory cells which are associated with and selectable via normal row addresses and (ii) a redundant row of memory cells which is associated with and selectable via a redundant row address, (b) address decoder circuitry to generate decoded row address data in response to an applied row address, and (c) a redundancy memory. The method includes determining the redundant row address based on detecting one or more bit failures or anticipated bit failures of memory cells of a row of memory cells of the plurality of normal rows of memory cells, generating a decoded redundant row address data which corresponds to the redundant row address via the address decoder, generating a redundancy program signal, and storing the decoded redundant row address data in the redundancy memory in response to a redundancy program signal.

The method may further include temporarily or permanently storing the decoded redundant row address data in the redundancy memory in response to a redundancy program signal.

In another principle aspect, the present inventions are directed to a method of operating an integrated circuit device including (a) a memory cell array having a plurality of memory cells arranged in a matrix of rows and columns including (i) a plurality of normal rows of memory cells which are associated with and selectable via normal row addresses and (ii) a redundant row of memory cells which is associated with and selectable via a redundant row address, (b) address decoder circuitry to generate decoded row address data in response to an applied row address, (c) a redundancy memory to store decoded redundant row address data, (d) normal word line drivers and (e) redundant word line drivers.

In this aspect, the method comprises generating decoded row address data in response to an applied row address, responsively enabling (i) at least one of the normal rows of memory cells or (ii) the redundant row of memory cells using the decoded row address data, and determining, during operation, whether the decoded row address data corresponds to the decoded redundant row address data stored in the redundancy memory, and, in response thereto, enabling the redundant word line drivers and disabling the normal word line drivers.

The method of this aspect of the inventions may include generating decoded redundant row address data which corresponds to the redundant row address via the address decoder, and storing the decoded redundant row address data in the redundancy memory in response to a redundancy program signal. The method may also include determining the redundant row address based on detecting one or more bit failures or anticipated bit failures of memory cells of a row of memory cells of the plurality of normal rows of memory cells, generating a decoded redundant row address data which corresponds to the redundant row address via the address decoder, generating a redundancy program signal, and storing the decoded redundant row address data in the redundancy memory in response to a redundancy program signal.

In addition, the method may further include generating a decoded redundant row address data which corresponds to the redundant row address via the address decoder, generating a redundancy program signal and storing the decoded redundant row address data in the redundancy memory in response to a redundancy program signal. In addition, the method may include generating a decoded redundant row address data which corresponds to the redundant row address via the address decoder, and storing the decoded redundant row address data in the redundancy memory. Indeed, the method may include temporarily storing the decoded redundant row address data in the redundancy memory in response to a redundancy program signal.

Again, there are many inventions, and aspects of the inventions, described and illustrated herein. This Summary of the Inventions is not exhaustive of the scope of the present inventions. Moreover, this Summary of the Inventions is not intended to be limiting of the inventions or the claims (whether the currently presented claims or claims of a divisional/continuation application) and should not be interpreted in that manner. While certain embodiments have been described and/or outlined in this Summary of the Inventions, it should be understood that the present inventions are not limited to such embodiments, description and/or outline, nor are the claims limited in such a manner (which should also not be interpreted as being limited by the Summary of the Inventions).

Indeed, many other aspects, inventions and embodiments, which may be different from and/or similar to, the aspects, inventions and embodiments presented in this Summary, will be apparent from the description, illustrations and claims, which follow. In addition, although various features, attributes and advantages have been described in this Summary of the Inventions and/or are apparent in light thereof, it should be understood that such features, attributes and advantages are not required whether in one, some or all of the embodiments of the present inventions and, indeed, need not be present in any of the embodiments of the present inventions.

BRIEF DESCRIPTION OF THE DRAWINGS

In the course of the detailed description to follow, reference will be made to the attached drawings. These drawings show different aspects of the present inventions and, where appropriate, reference numerals illustrating like structures, components, materials and/or elements in different figures are labeled similarly. It is understood that various combinations of the structures, components, materials and/or elements, other than those specifically shown, are contemplated and are within the scope of the present inventions.

Moreover, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, many of those permutations and combinations will not be discussed separately herein.

FIGS. 7A-7C are schematic block diagram illustrations of an exemplary devices in which the row redundancy architecture may be implemented wherein FIG. 7A and 7C are logic devices (having logic circuitry and resident memory) and FIG. 7B is a memory device (having primarily of a memory array), according to certain aspects of the present inventions.

DETAILED DESCRIPTION

There are many inventions described and illustrated herein. In one aspect, the present inventions are directed to row redundancy architectures and techniques, including row redundancy circuitry for a memory cell array having a plurality of memory cells, arranged in a matrix of rows and columns. In another aspect, the present inventions are directed to methods of programming, configuring, controlling and/or operating such row redundancy circuitry. The memory cell array and redundancy circuitry may comprise a portion of an integrated circuit device, for example, a logic device (such as, a microcontroller or microprocessor) or a portion of a memory device (such as, a discrete memory).

Figure 1A:
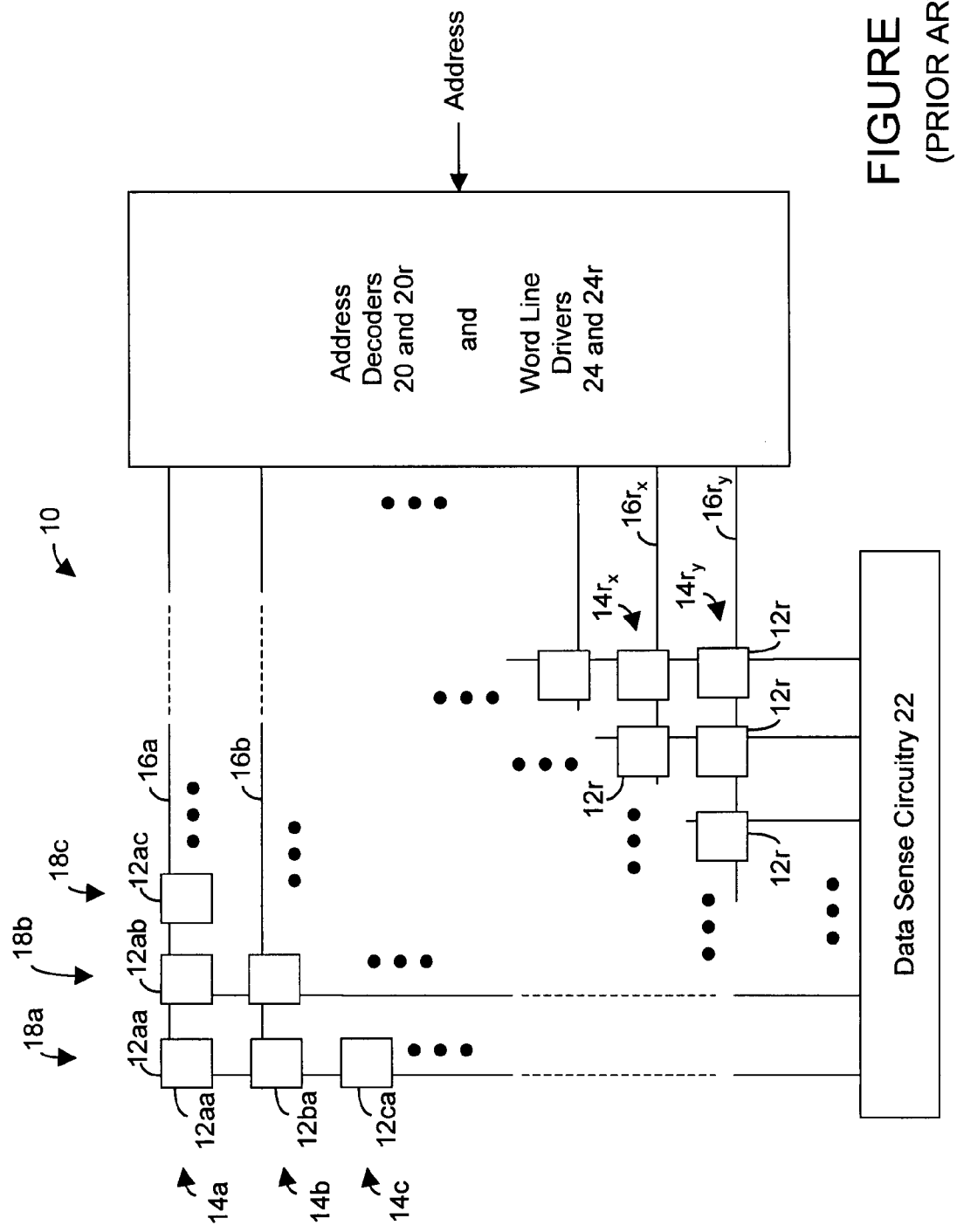
FIG. 1A is an exemplary schematic block diagram illustration of a conventional memory cell array having a plurality of memory cells arranged in an array of a plurality of rows and columns, in conjunction with row address decoders, word line drivers and data sense circuitry.
Figure 1B:
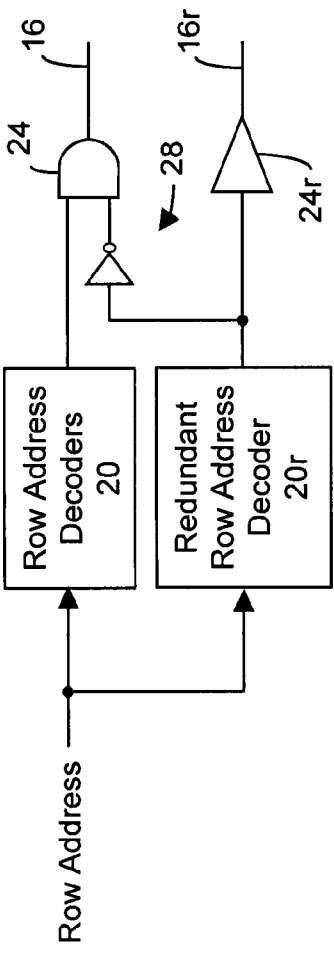
FIG. 1B is an exemplary schematic block diagram illustration of the conventional row redundancy architecture.
Figure 1C:
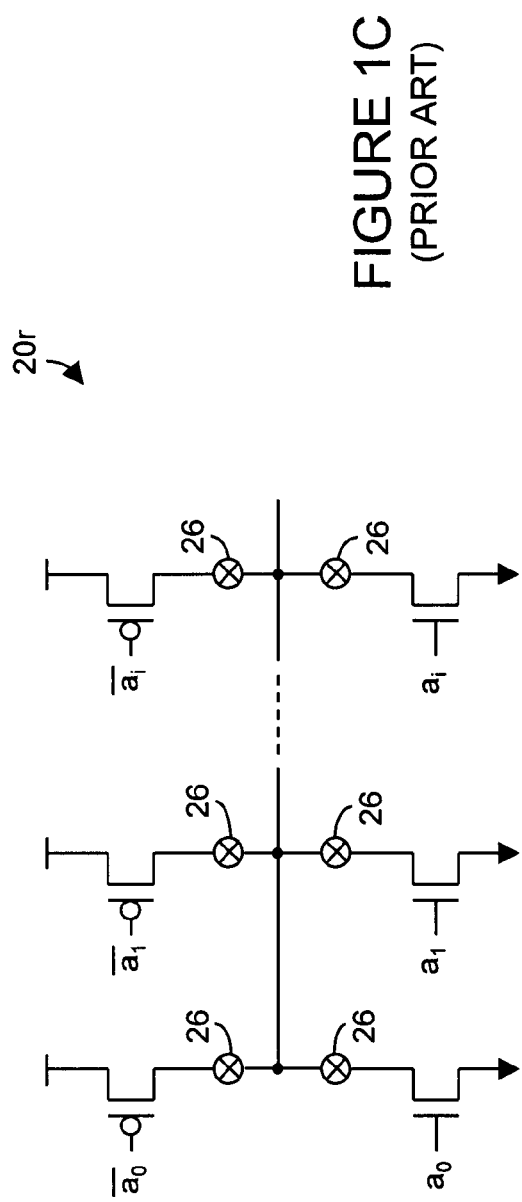
FIG. 1C is an exemplary schematic block diagram illustration of the conventional circuitry to program the redundant row decoder circuitry which, in this example, includes a plurality of fuses.

In one aspect, redundancy architectures implemented according to the present inventions may make more efficient use of the pre-existing addressing circuitry (for example, the row pre-decoders and decoders). Moreover, the present inventions may provide a significant area and power savings because, among other things, the redundant row address decoder (as described above with reference to FIGS. 1A-1C) may be eliminated. Such redundancy circuitry is quite large, often consuming as much area as the normal row decoders.

Notably, the present inventions may be implemented in conjunction with any memory cell technology, whether now known or later developed. For example, the memory cells may include one or more transistors having electrically floating body regions, one transistor-one capacitor architectures, electrically floating gate transistors, junction field effect transistors (often referred to as JFETs), or any other memory/transistor technology whether now known or later developed. All such memory technologies are intended to fall within the scope of the present inventions.

Moreover, the present inventions may be implemented in conjunction with any type of memory (including discrete or integrated with logic devices), whether now known or later developed. For example, the memory may be a DRAM, SRAM and/or Flash. All such memories are intended to fall within the scope of the present inventions.

In one embodiment, the memory cells of the memory cell array may include at least one transistor having an electrically floating body transistor which stores an electrical charge in the electrically floating body region thereof. The amount of charge stored in the in the electrically floating body region correlates to the data state of the memory cell. One type of such memory cell is based on, among other things, a floating body effect of semiconductor on insulator (SOI) transistors. (See, for example, (1) Fazan et al., U.S. Pat. No. 6,969,662, (2) Okhonin et al., U.S. Patent Application Publication No. 2006/0131650 ("Bipolar Reading Technique for a Memory Cell Having an Electrically Floating Body Transistor"), (3) Okhonin et al., U.S. Patent Application Publication No. 2007/0058427 ("Memory Cell and Memory Cell Array Having an Electrically Floating Body Transistor, and Methods of Operating Same"), (4) U.S. Non-Provisional patent application Ser. No. 11/633,311, Okhonin, filed Dec. 4, 2006 and entitled "Electrically Floating Body Memory Cell and Array, and Method of Operating or Controlling Same", and (5) U.S. Non-Provisional patent application Ser. No. 11/703,429, Okhonin et al., filed on Feb. 7, 2007 and entitled "Multi-Bit Memory Cell Having Electrically Floating Body Transistor, and Method of Programming and Reading Same", all of which are incorporated by reference herein in its entirety). In this regard, the memory cell may consist of a partially depleted (PD) or a fully depleted (FD) SOI transistor or bulk transistor (transistor which formed in or on a bulk material/substrate) having a gate, which is disposed adjacent to the electrically floating body and separated therefrom by a gate dielectric. The body region of the transistor is electrically floating in view of the insulation or non-conductive region, for example, in bulk-type material/substrate, disposed beneath the body region. The state of memory cell may be determined by the concentration or amount of charge contained or stored in the body region of the SOI or bulk transistor.

Figure 2A:
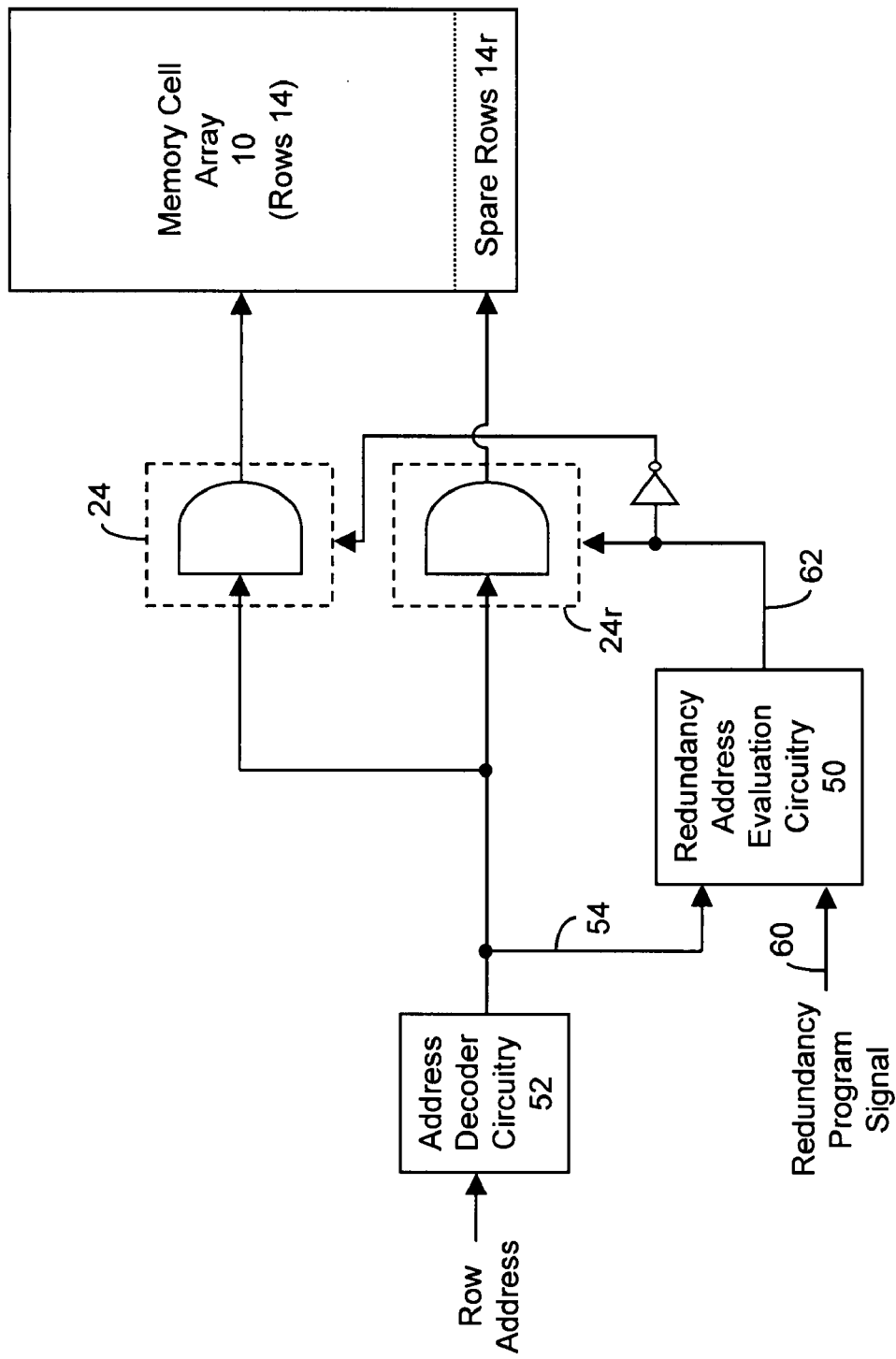
FIGS. 2A-2D are schematic block diagram illustrations of exemplary embodiments of the row redundancy architecture, in conjunction with memory cell array (having redundant rows), according to certain aspects of the present inventions.
Figure 3A:
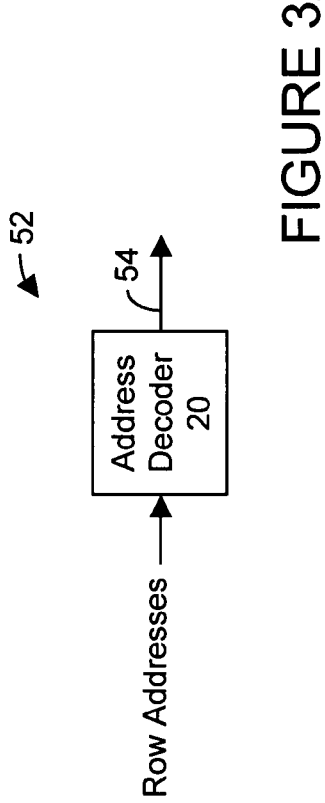
FIGS. 3A and 3B are schematic block diagram illustrations of exemplary embodiments of the row address decoder circuitry, according to certain aspects of the present inventions.
Figure 4A:
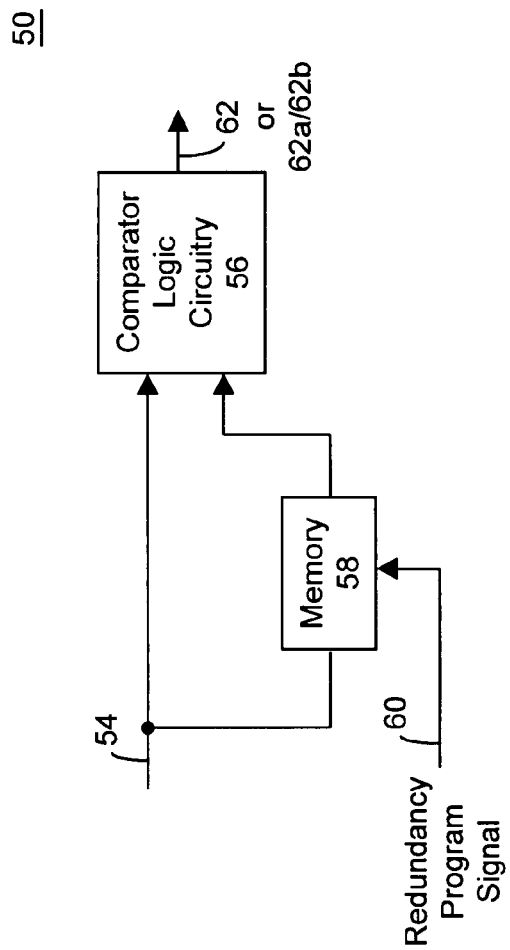
FIGS. 4A and 4B are schematic block diagram illustrations of exemplary embodiments of the redundancy address evaluation circuitry, according to certain aspects of the present inventions.

With reference to FIGS. 2A, 3A and 4A, the row redundancy architecture according to one exemplary embodiment of the present inventions includes redundancy address evaluation circuitry 50 electrically coupled to address decoder circuitry 52 to receive a set of input signals which are representative of the applied row address that is decoded by address decoder circuitry 52. In this embodiment, redundancy address evaluation circuitry 50 includes comparator logic circuitry 56 and memory 58. (See, for example, FIG. 4A). The output(s) of redundancy address evaluation circuitry 50 is applied to word line drivers 24 and redundant word line drivers 24r to responsively enable/disable drivers 24 and 24r.

The comparator logic circuitry 56 includes circuitry that compares the decoded address with a decoded address which is stored in memory 58. The comparator logic circuitry 56 may be any type of circuitry, whether now known or later developed, that compares data (for example, discrete circuitry or logic, state machine, processor or the like, whether digital or analog circuitry, and/or whether hardwired or programmable); all such circuitry is intended to fall within the scope of the present inventions. For example, comparator logic circuitry 56 may be a plurality of EX-OR logic gates (see, for example, FIG. 4B), a plurality of AND logic gates or other logic circuitry (for example, a processor that is suitably programmed) which are interconnected to determine whether the decoded address data (here, the output of address decoder circuitry 52 which is representative of the decoded row address that is applied to address decoder circuitry 52 via decoded address signal lines 54) "matches" data which is representative of the decoded row address having one or more defective memory cells (i.e., a defective row of memory cells).

The memory 58 stores data which is representative of a decoded row address that corresponds to an address of a row of memory cells (for example, including one or more defective or inoperative memory cells) that is to be "replaced" by the redundant or spare row of memory cells. The memory 58 may be any circuitry, whether now known or later developed, that stores data (here, the decoded row address which represents the row having the defective memory cells). For example, memory 58 may be one or more fuses or anti-fuses, or DRAM, SRAM, PROM, EPROM, EEPROM cells, and/or latch or register circuitry (for example, a plurality of latches or registers). Notably, all forms or types of memory, whether now known or later developed, are intended to fall within the scope of the present inventions.

In one exemplary embodiment, with reference to FIGS. 2A and 4A, the decoded row address data may be stored in memory 58 (for example, a latch or register) in response to a store control signal (or redundancy program signal) applied on redundancy program signal line 60. In this embodiment, row decoder 20 decodes the row address of the row of memory cells to be substituted or replaced by the redundant or spare row of memory cells 14r. The row address, in a decoded form, is provided to memory 58 via signal lines 54. In response to the store data signal applied on signal line 60, memory 58 stores the decoded row address data in memory 58. Notably, where, for example, fuses or anti-fuses are employed, well known programming techniques may be employed to store the decoded row address data in the fuses or anti-fuses.

In operation, row address decoder circuitry 52 receives a row address and, in response, generates a decoded row address which corresponds to the applied row address. The decoded row address is provided to, among other things, redundancy address evaluation circuitry 50 which determines whether the decoded row address data corresponds to or "matches" data stored in memory 58.

In the event that comparator logic circuitry 56 determines a "match" between the decoded row address data and the data stored in memory 58, comparator logic circuitry 56 generates a redundancy/spare row enable signal on signal line 62. The redundancy/spare row enable signal enables redundant word line drivers 24r and disables normal word line drivers 24. In this way, memory cells 12 associated with redundant word line 16r are accessed (for example, read from or written to) while the memory cells 12 associated with "replaced" word line 16 (and driven by an associated word line driver 24) are not accessed.

Where the decoded row address data does not correspond to the data stored in memory 58, word line drivers 24 are employed to access an associated row 14 of memory cells and word line drivers 24r are disabled. Under this circumstance, the applied row address does not correspond to a row of memory cells to be "replaced" or "substituted" by the redundant or spare row(s) of memory cells.

Figure 5:
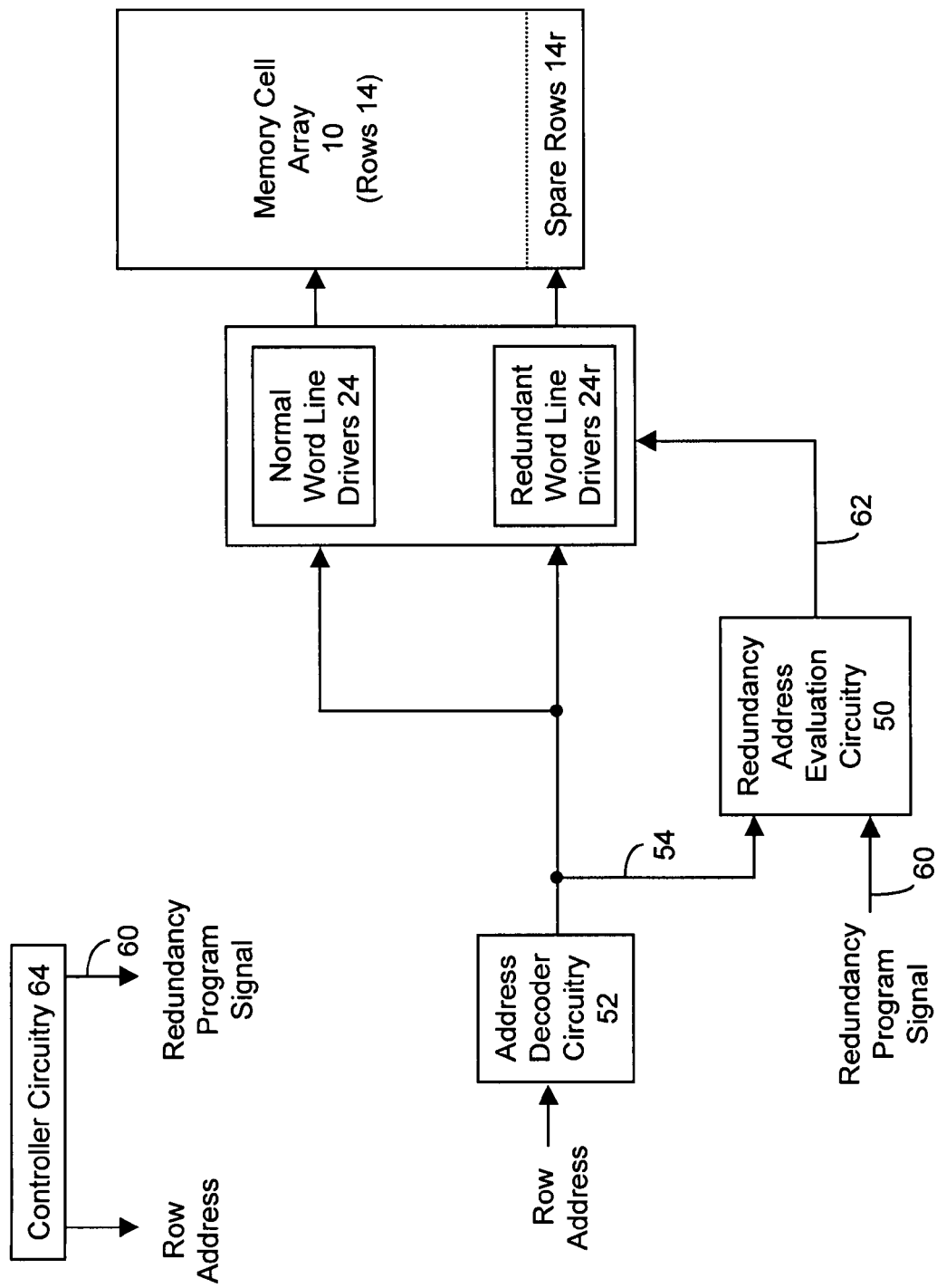
FIGS. 5 and 6 are schematic block diagram illustrations of exemplary embodiments of the row redundancy architecture, in conjunction with memory cell array (having redundant rows) and controller circuitry, according to certain aspects of the present inventions.

As mentioned above, memory 58 stores data which is representative of one or more decoded row addresses that correspond to one or more row addresses of memory cells (for example, including one or more defective or inoperative memory cells) that is/are to be "replaced" or "substituted" by the redundant or spare row(s) of memory cells. The memory 58 may be one time programmable (for example, programmed during test or at manufacture) or more than one time programmable (for example, during test, start-up/power-up, during an initialization sequence and/or during operation (in situ)). For example, in one embodiment, the data which is representative of the decoded row address may be "stored" in memory 58, for example, at start-up/power-up and/or during an initialization sequence. The address(es) of the row(s) of memory cells to be "replaced" or "substituted" by the redundant or spare row(s) of memory cells may be provided and/or determined by external (i.e., off-chip—for example, resident on a common printed circuit board) or internal/integrated circuitry (i.e., on-chip).

Where the circuitry which detects one or more rows of memory cells to be "replaced" or "substituted" by one or more redundant or spare rows is internal/integrated on the same die as memory array 10 and the redundancy circuitry, the decoded row address data (which correspond to one or more row addresses of memory cells including, for example, one or more defective or inoperative memory cells) may be provided by a controller at, for example, start-up/power-up, during an initialization sequence and/or during operation. With reference to FIG. 5, in one embodiment, controller circuitry 64 (for example, built-in self-test (BIST) circuitry) may be employed to detect one or more defective or inoperative memory cells of memory cell array 10. In response to detecting one or more memory cells to be "replaced", controller circuitry 64 applies the associated row address or addresses of such memory cells to row decoder circuitry 52 and, in addition, applies the store data signal (redundancy program signal) 60 to redundancy address evaluation circuitry 50 (and, in particular, to memory 58). As mentioned above, the decoded row address data is provided to redundancy address evaluation circuitry 50 (via signal lines 54) and, in response to the store data signal (or redundancy program signal) 60, data which is representative of the decoded row address (for example, a defective row) is stored in memory 58 (for example, stored in a latch).

Notably, the programming of the redundancy circuitry (for example, by controller circuitry 64) may be a one-time process, for example, during start-up/power-up and/or during an initialization sequence. The programming may also be in situ, for example, in response to detection of a bit failure or anticipated bit failure by controller circuitry 64, for example, during operation of the memory cell array 10.

The controller circuitry 64 may be any type of circuitry (for example, discrete circuitry or logic, state machine, processor or the like, whether digital or analog circuitry, and/or whether hardwired or programmable) that may detect one or more defective or inoperative memory cells. For example, controller circuitry 64 may be external (non-integrated) circuitry or internal (integrated) circuitry, such as, for example, BIST circuitry. (See, for example, "A 30-ns 64-MB DRAM with Built-in Self-Test and Self-Repair Function", Tanabe et al., IEEE Journal of Sold-Sate Circuits, Vol. 27, No. 11, November 1992, pp. 1525-1533). Notably, all forms or types of circuitry that are suitable to detect one or more defective or inoperative memory cells, whether now known or later developed, is intended to fall within the scope of the present inventions.

Figure 2B:
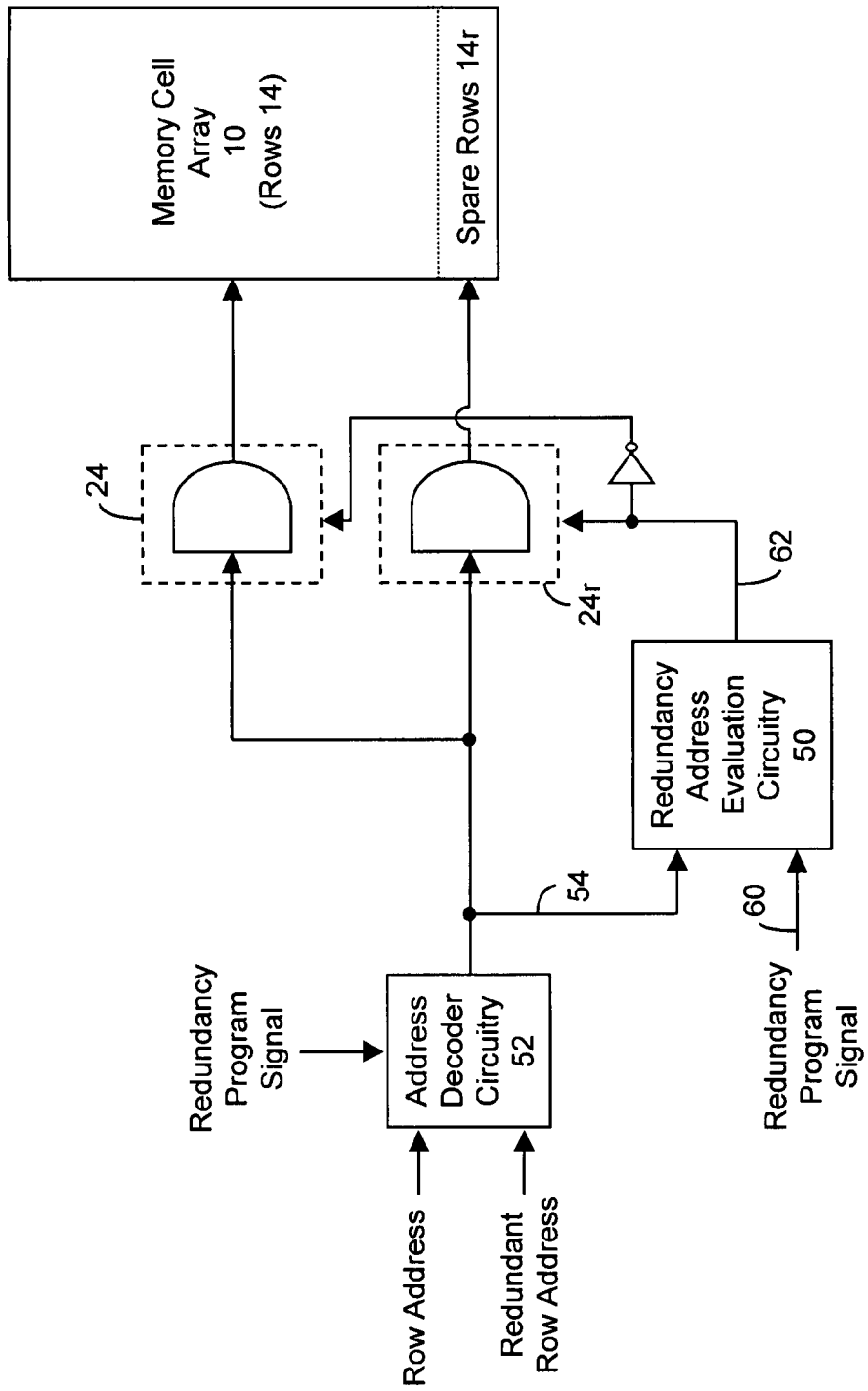
Figure 2C:
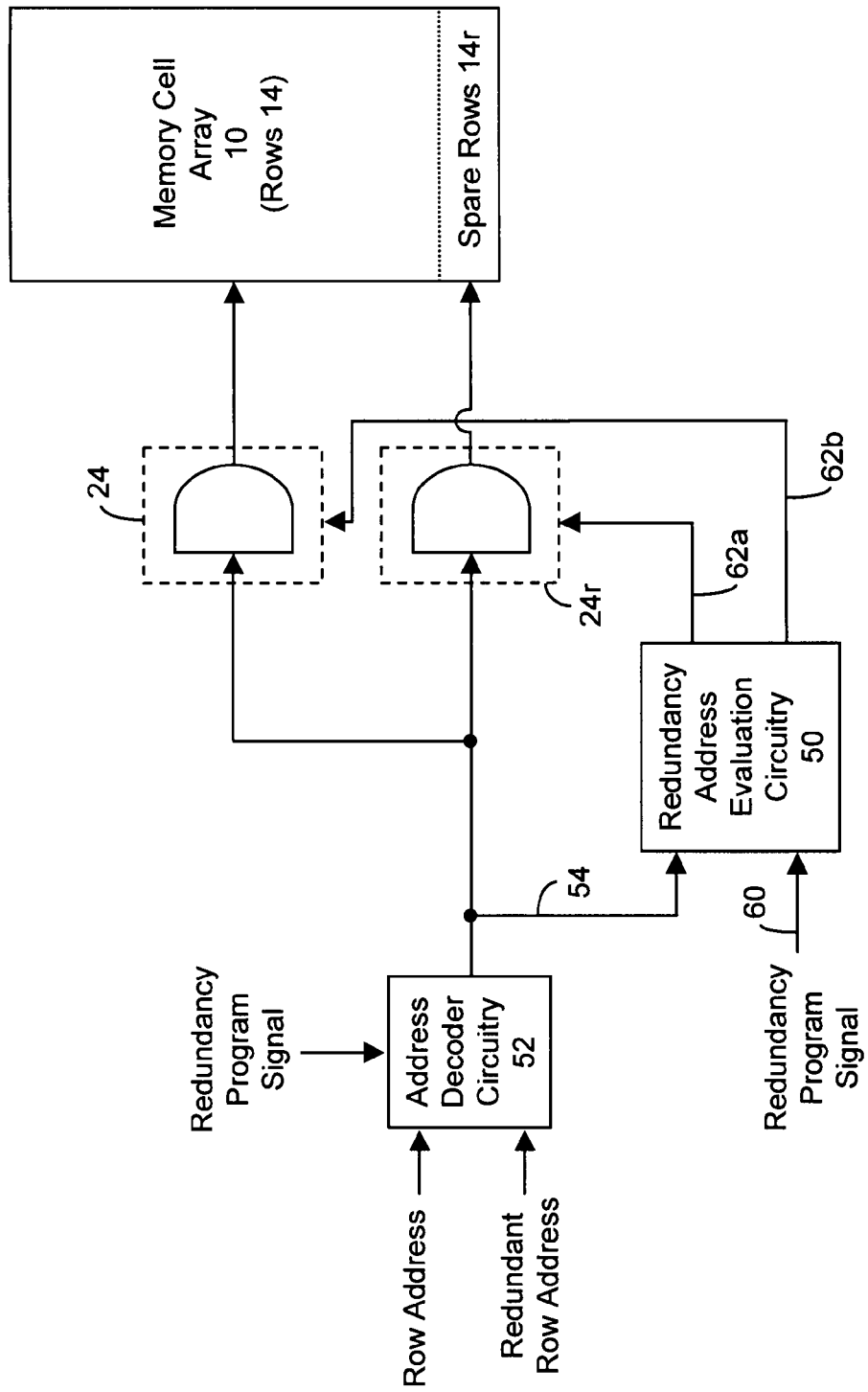
Figure 2D:
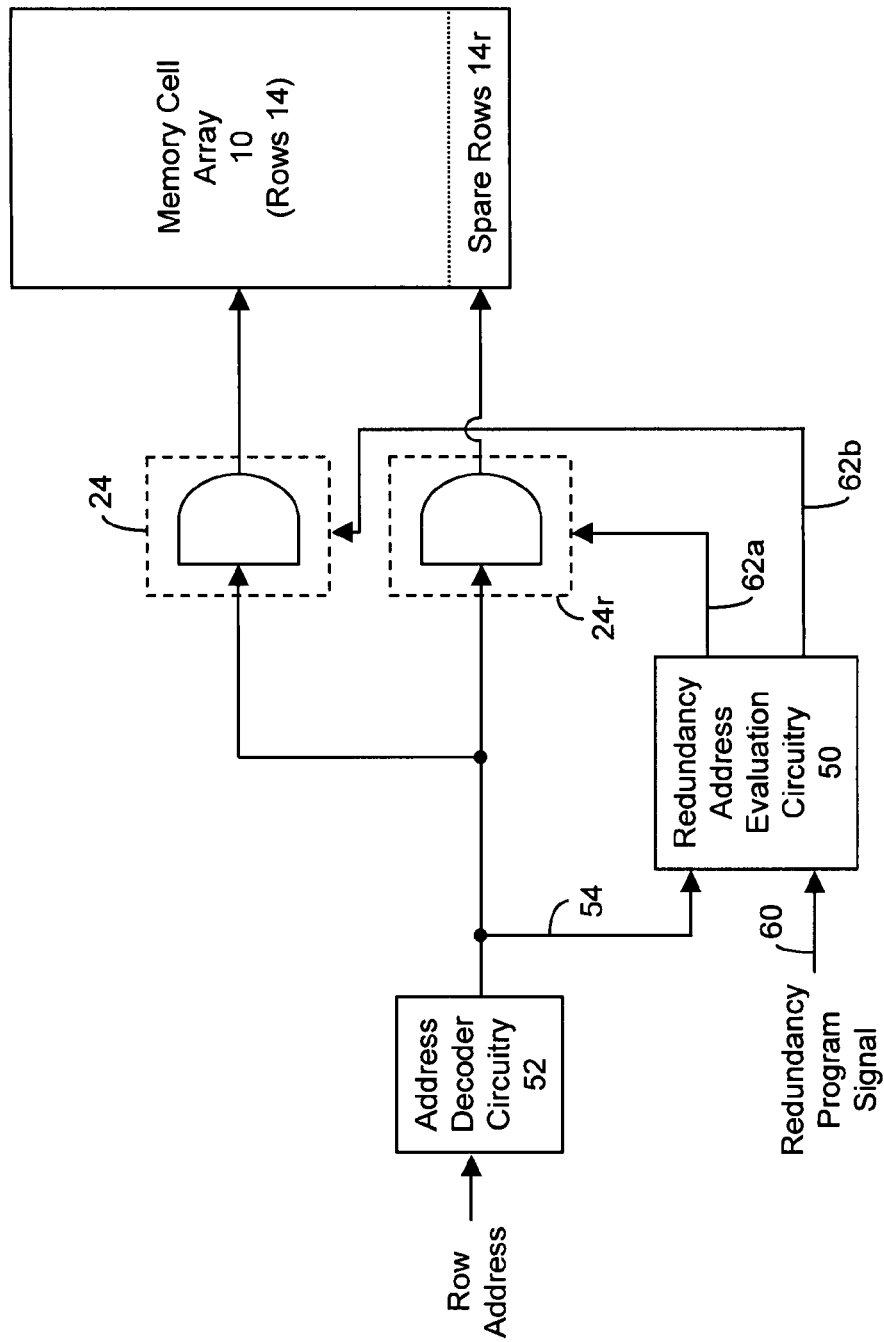
Figure 3B:
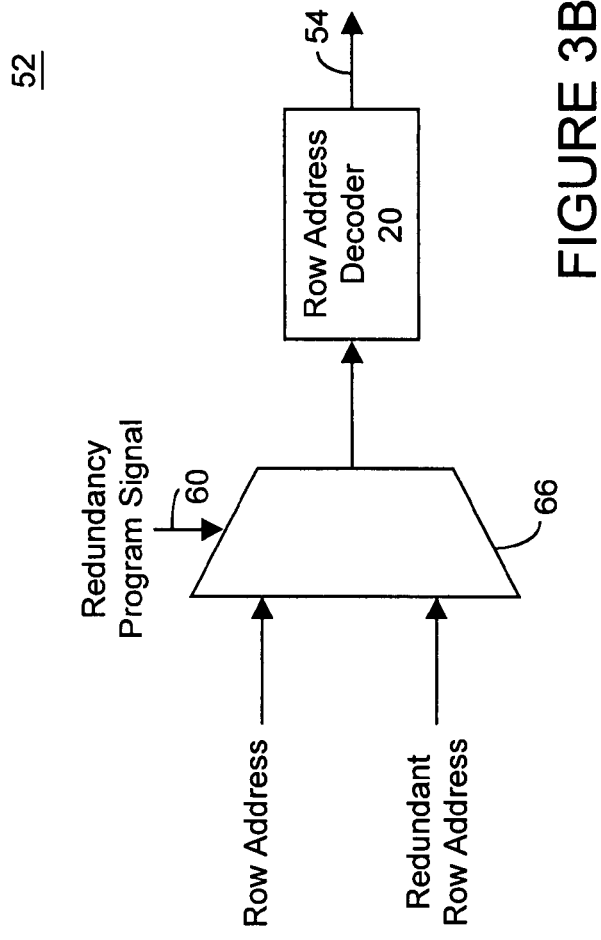

With reference to FIGS. 2B, 3B and 4A, in another exemplary embodiment, address decoder circuitry 52 receives "normal" row addresses and separate redundant row address(es). The "normal" row addresses are addresses that are applied during normal operation and the redundant row address(es) correspond to row(s) of memory cells that are to be "replaced" or "substituted" by redundant or spare row(s) 14r. The "normal" row addresses may be addresses which correspond to operative or inoperative/defective rows in memory cell array 10. In contrast, the redundant row address(es) are addresses that are applied to address decoder circuitry 52 during the programming or configuration of the redundancy circuitry (for example, programming of redundancy address evaluation circuitry 50).

As such, during normal operation (for example, during performance of normal read and write operations), multiplexer circuitry 66 provides the row addresses to row address decoder 20. However, when the redundancy circuitry is being programmed, a store data signal (or redundancy program signal 60) is applied to multiplexer circuitry 66 (see FIG. 3B) which instructs/causes multiplexer circuitry 66 to provide the address applied to the redundant row address inputs to row address decoder 20. As such, under these conditions, row address decoder 20 decodes the address associated with a row(s) of memory cells that is/are to be "replaced" or "substituted" by the redundant or spare row(s) 14r.

With continued reference to FIGS. 2B, 3B and 4A, the decoded row address data (which is representative of row 14 that is being "replaced" or "substituted" by the redundant or spare row(s) 14r) is provided to redundancy address evaluation circuitry 50. The memory 58, in response to the redundancy program signal applied on signal line 60, stores the decoded row address data. Notably, after programming, the embodiment of FIGS. 2B, 3B and 4A may operate in the same manner as discussed above with respect to the embodiment of FIGS. 2A, 3A and 4A. The entire discussion above, relative to the embodiment of FIGS. 2A, 3A and 4A, is entirely applicable to the embodiment of FIGS. 2B, 3B and 4A. For the sake of brevity, those discussions will not be repeated in detail but are discussed briefly below.

Briefly, in normal operation (and after programming of the redundancy circuitry), row address decoder circuitry 52 receives a row address applied on the "normal" row address lines and, row decoder 20 responsively decodes the address. The decoded row address is provided to, among other things, redundancy address evaluation circuitry 50 which determines whether the decoded row address data corresponds to or "matches" data stored in memory 58. The comparator logic circuitry 56 compares the decoded row address data to the data stored in memory 58. Where the decoded row address data does not correspond to the data stored in memory 58, word line drivers 24 are employed to access an associated row 14 of memory cells and redundant word line drivers 24r are disabled. However, where comparator logic circuitry 56 determines a "match" between the decoded row address data and the data stored in memory 58, comparator logic circuitry 56 generates a redundancy/spare row enable signal on signal line 62. The redundancy/spare row enable signal disables normal word line drivers 24 corresponding to the row address and enables redundant word line drivers 24r. In this way, memory cells 12 associated with redundant word line 16r are accessed (for example, read from or written to) while the memory cells 12 associated with "replaced" word line 16 (and driven by an associated word line driver 24) are not accessed.

Figure 6:
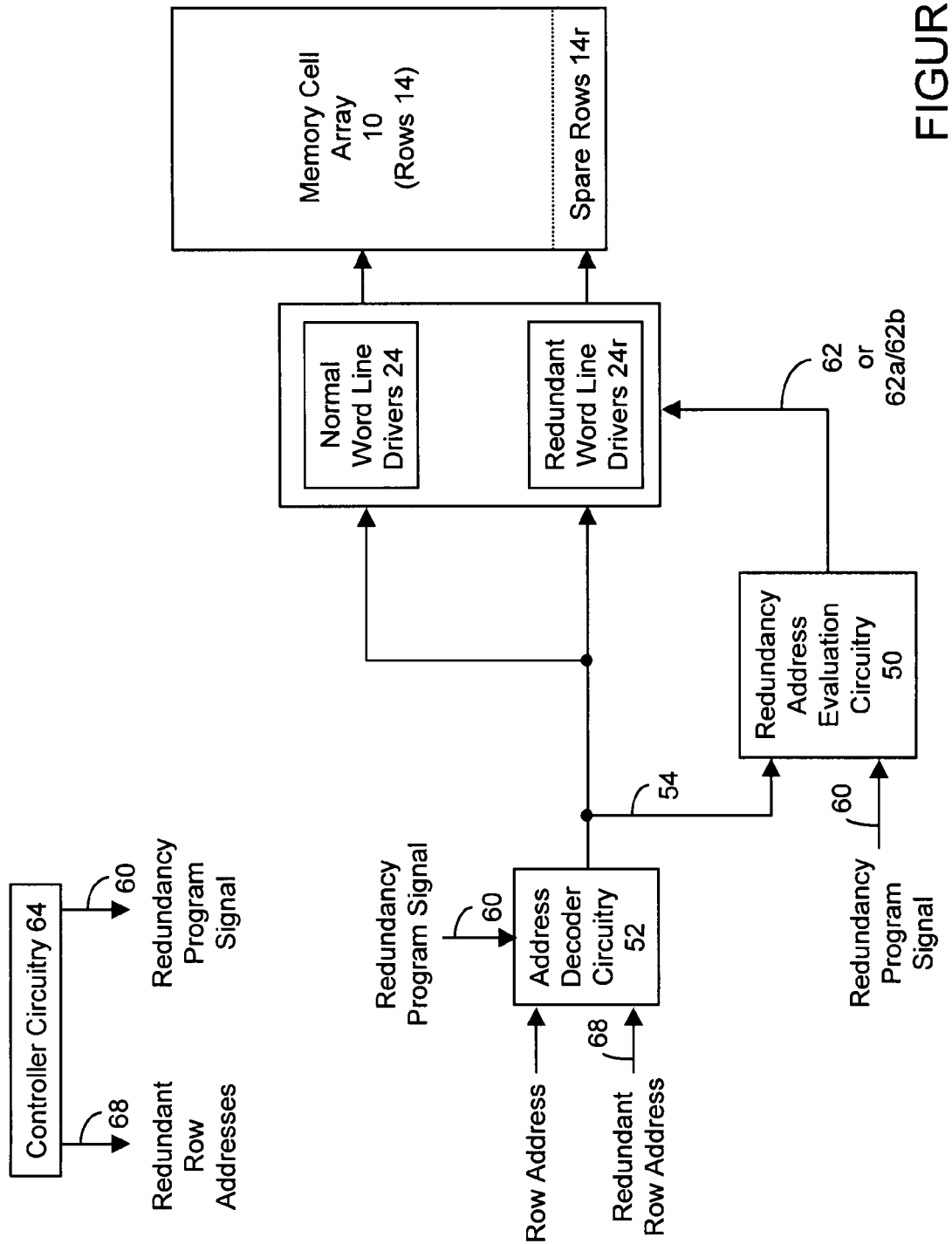

As discussed above, the circuitry which provides the redundant row address(es) during the programming of the redundancy circuitry may or may not be integrated with the redundancy circuitry. In one embodiment, controller circuitry 64 generates the redundant row address(es). In this regard, with reference to FIG. 6, in one exemplary embodiment, controller circuitry 64 (i) generates corresponding row addresses to be provided to addresses decoder circuitry 52, and (ii) generates the store data signal or redundancy program signal on signal line 60 to enable memory 58 to store data which is representative of the decoded row address data (which correspond to one or more row addresses of memory cells, for example, including one or more defective or inoperative memory cells). As mentioned above, controller circuitry 64 (for example, BIST circuitry) may program the redundancy circuitry at, for example, start-up/power-up, during an initialization sequence and/or during operation.

In another embodiment, controller circuitry 64 (i) detects one or more rows of memory cells to be "replaced" or "substituted" by one or more redundant or spare rows, (ii) generates corresponding row addresses to be provided to addresses decoder circuitry 52, and (iii) generates the store data signal or redundancy program signal on signal line 60 to enable memory 58 to store data which is representative of the decoded row address data. In this embodiment, controller circuitry 64 (for example, BIST circuitry) may detect one or more defective or inoperative memory cells of memory cell array 10. In response to detecting, for example, one or more defective memory cells, controller circuitry 64 applies the row address(es) associated with such memory cells to row decoder circuitry 52 (via signal lines 68). In addition, controller circuitry 64 may enable memory 58 (via signal line 60) to store the decoded address data. As mentioned above, the decoded row address data is provided to redundancy address evaluation circuitry 50 (via signal lines 54) and, in response to the store data signal (or redundancy program signal), the data which is representative of the decoded row address is stored in memory 58 (for example, stored in a latch or register).

Notably, programming the redundancy circuitry (for example, by controller circuitry 64) may be a one-time process, for example, during start-up/power-up and/or during an initialization sequence. The programming may also be in situ, for example, in response to detection of a bit failure or anticipated bit failure by controller circuitry 64, for example, during operation of the memory cell array 10.

Figure 7A:
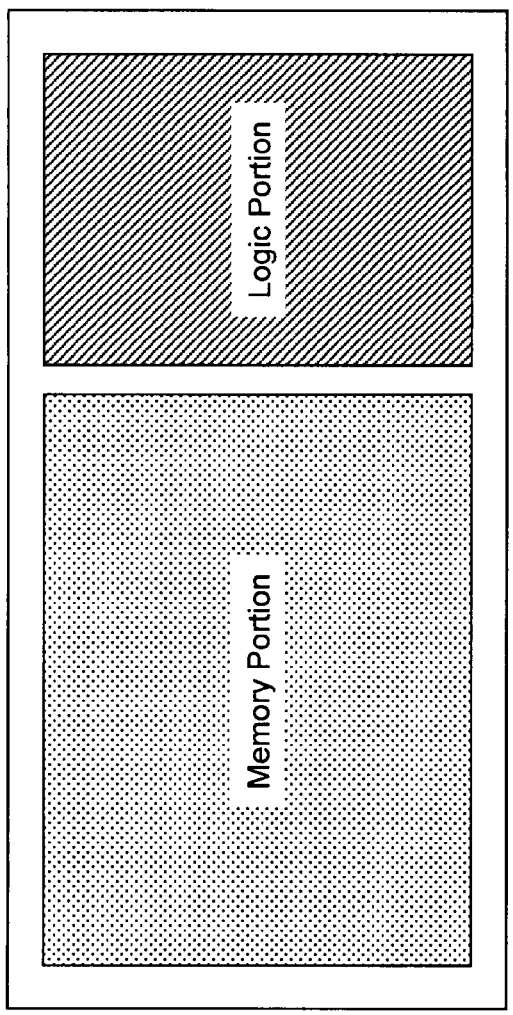
Figure 7B:
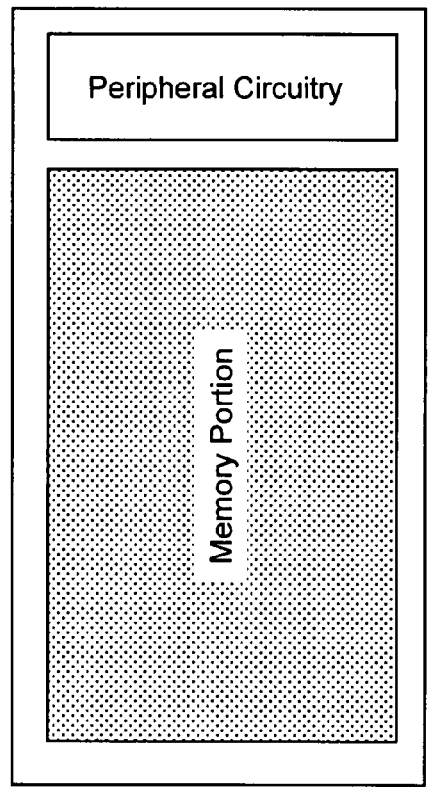
Figure 7C:
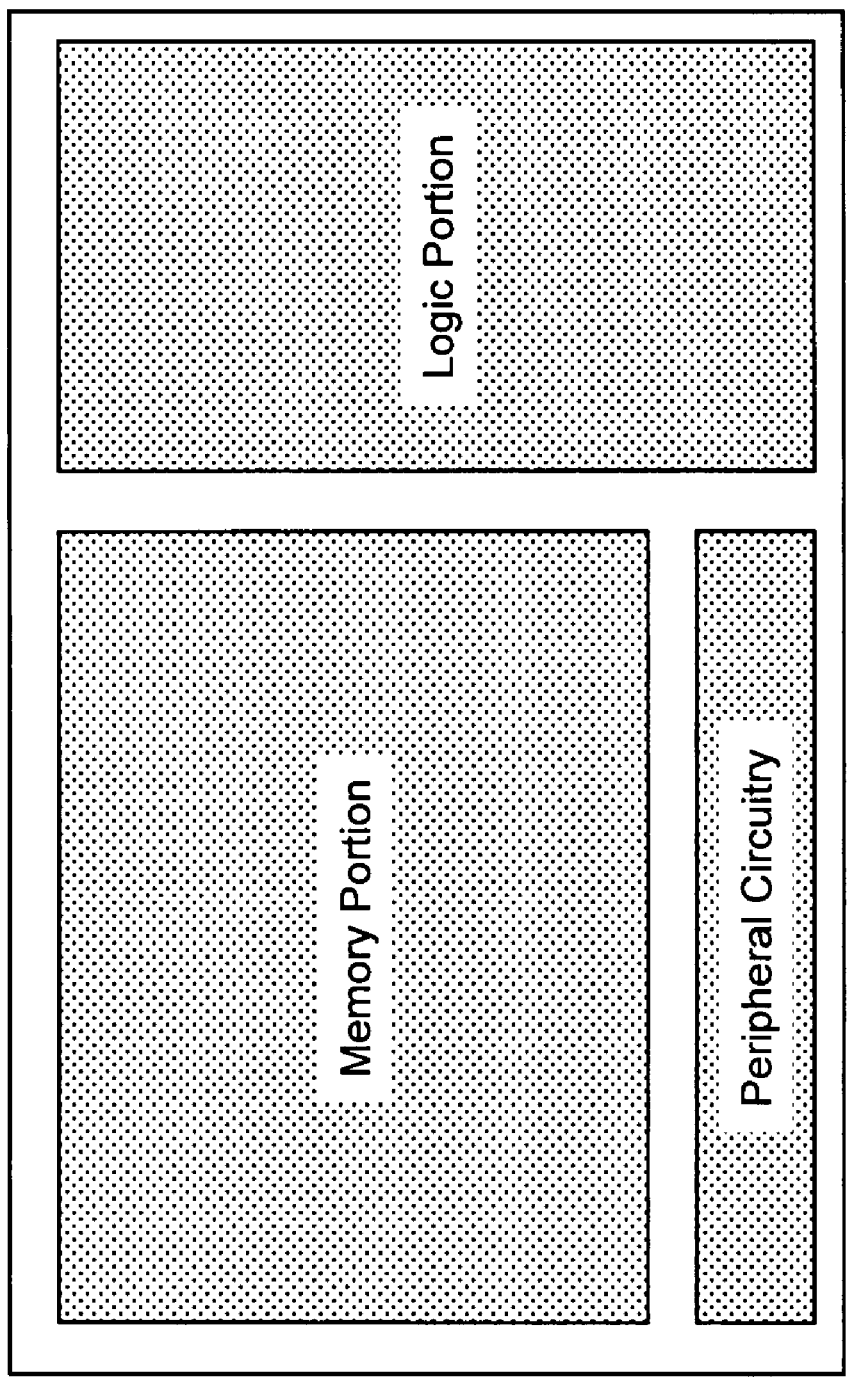

As mentioned above, the present inventions may be implemented in a logic device having a memory portion and logic portion (see, for example, FIGS. 7A and 7C), or an integrated circuit that is primarily a memory device (see, for example, FIG. 7B). The logic device may be, for example, a processor, controller, field programmable gate array, state machine, and/or a device including same. Indeed, the present inventions may be implemented in any device employing a memory array and redundancy architecture or technique.

Further, as mentioned above, the present inventions may be employed in conjunction with any memory cell technology now known or later developed. For example, the present inventions may be implemented in conjunction with a memory array, having a plurality of memory cells each including an electrically floating body transistor. (See, for example, (1) U.S. Pat. No. 6,969,662, (2) Okhonin et al., U.S. Patent Application Publication No. 2006/0131650 ("Bipolar Reading Technique for a Memory Cell Having an Electrically Floating Body Transistor"), (3) Okhonin et al., U.S. Patent Application Publication No. 2007/0058427 ("Memory Cell and Memory Cell Array Having an Electrically Floating Body Transistor, and Methods of Operating Same"), (4) U.S. Non-Provisional patent application Ser. No. 11/633,311, Okhonin, filed Dec. 4, 2006 and entitled "Electrically Floating Body Memory Cell and Array, and Method of Operating or Controlling Same", and (5) U.S. Non-Provisional patent application Ser. No. 11/703,429, Okhonin et al., filed on Feb. 7, 2007 and entitled "Multi-Bit Memory Cell Having Electrically Floating Body Transistor, and Method of Programming and Reading Same"). In this regard, the memory cell may consist of a PD or a FD SOI transistor (or transistor formed on or in bulk material/substrate) having a gate, which is disposed adjacent to the electrically floating body and separated therefrom by a gate dielectric. The body region of the transistor is electrically floating in view of the insulation or non-conductive region (for example, in bulk-type material/substrate) disposed beneath the body region. The state of memory cell is determined by the concentration of charge within the body region of the SOI transistor.

The memory cells of the memory cell array may be comprised of N-channel, P-channel and/or both types of transistors. Indeed, circuitry that is peripheral to the memory array (for example, sense amplifiers or comparators, row and column address decoders, as well as line drivers (not illustrated in detail herein)) may include P-channel and/or N-channel type transistors. Where N-channel type transistors or P-channel type transistors are employed as memory cells 12 in the memory array(s) 10, suitable write and read voltages are well known to those skilled in the art (and in view of the U.S. Patents and U.S. patent applications incorporated herein by reference).

Moreover, the present inventions may be implemented in conjunction with any memory cell array configuration and/or arrangement of memory cell array 10. In this regard, integrated circuit device (for example, memory or logic device) may include a plurality of memory cell arrays, each having a plurality of memory cells, wherein certain of the circuitry (for example, redundancy address evaluation circuitry 50) is dedicated to one or more arrays and controller circuitry 64 is shared among the arrays.

In addition, the present inventions may be employed or implemented in conjunction with one or more of the inventions, memory cells, memory arrays, and techniques for programming, reading, controlling and/or operating a memory cell and array including, for example, (1) Okhonin et al., U.S. Patent Application Publication No. 2006/0131650 ("Bipolar Reading Technique for a Memory Cell Having an Electrically Floating Body Transistor"), (2) Okhonin et al., U.S. Patent Application Publication No. 2007/0058427 ("Memory Cell and Memory Cell Array Having an Electrically Floating Body Transistor, and Methods of Operating Same"), (3) U.S. Non-Provisional patent application Ser. No. 11/633,311, Okhonin, filed Dec. 4, 2006 and entitled "Electrically Floating Body Memory Cell and Array, and Method of Operating or Controlling Same", and (4) U.S. Non-Provisional patent application Ser. No. 11/703,429, Okhonin et al., filed on Feb. 7, 2007 and entitled "Multi-Bit Memory Cell Having Electrically Floating Body Transistor, and Method of Programming and Reading Same". The entire contents of these U.S. patent applications, including, for example, the inventions, features, attributes, architectures, configurations, materials, techniques and advantages described and illustrated therein, are hereby incorporated by reference herein. For the sake of brevity, those discussions will not be repeated; rather those discussions (text and illustrations), including the discussions relating to the memory cell, architecture, layout, structure, are incorporated by reference herein in its entirety.

In addition, the memory cells may be arranged, configured and/or controlled using any of the memory cell arrays, architectures and/or control/operation techniques. For example, the memory cells may be arranged, configured and/or controlled using any of the memory cell arrays, architectures and/or control/operation techniques described and illustrated in the following U.S. patent applications:

(1) application Ser. No. 10/450,238, which was filed by Fazan et al. on Jun. 10, 2003 and entitled "Semiconductor Device" (now U.S. Pat. No. 6,969,662);

(2) application Ser. No. 10/487,157, which was filed by Fazan et al. on Feb. 18, 2004 and entitled "Semiconductor Device" (now U.S. Pat. No. 7,061,050);

(3) application Ser. No. 10/829,877, which was filed by Ferrant et al. on Apr. 22, 2004 and entitled "Semiconductor Memory Cell, Array, Architecture and Device, and Method of Operating Same" (now U.S. Pat. No. 7,085,153);

(4) application Ser. No. 10/840,009, which was filed by Ferrant et al. on May 6, 2004 and entitled "Semiconductor Memory Device and Method of Operating Same" (U.S. Patent Application Publication No. US 2004/0228168); and (5) application Ser. No. 10/941,692, which was filed by Fazan et al. on Sep. 15, 2004 and entitled "Low Power Programming Technique for a One Transistor SOI Memory Device & Asymmetrical Electrically Floating Body Memory Device, and Method of Manufacturing Same" (now U.S. Pat. No. 7,184,298).

The entire contents of these five (5) U.S. patent applications, including, for example, the inventions, features, attributes, architectures, configurations, materials, techniques and advantages described and illustrated therein, are hereby incorporated by reference herein. For the sake of brevity, those discussions will not be repeated; rather those discussions (text and illustrations), including the discussions relating to the memory cell, architecture, layout, structure, are incorporated by reference.

Notably, the present inventions may be fabricated using well known techniques and/or materials. Indeed, any fabrication technique and/or material, whether now known or later developed, may be employed to fabricate the memory cells, transistors and/or memory array(s). For example, the present inventions may employ silicon (whether bulk-type or SOI), germanium, silicon/germanium, gallium arsenide or any other semiconductor material in which transistors may be formed. Indeed, the electrically floating body transistors, memory cells, and/or memory array(s) may employ the techniques described and illustrated in non-provisional patent application entitled circuitry that is peripheral to the memory array (for example, data sense circuitry (for example, sense amplifiers or comparators), memory cell selection and control circuitry (for example, word line and/or source line drivers), as well as row and column address decoders) may include P-channel and/or N-channel type transistors.

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the embodiments, features, attributes and advantages of the inventions described and illustrated herein are not exhaustive and it should be understood that such other, similar, as well as different, embodiments, features, attributes and advantages of the present inventions are within the scope of the present inventions.

Figure 4B:
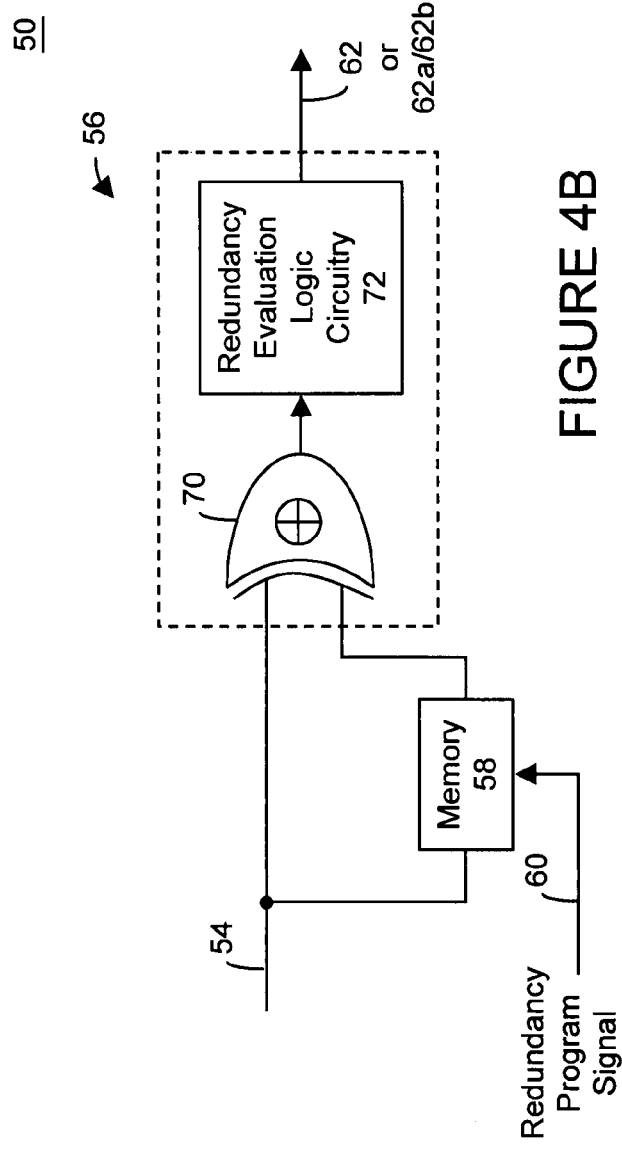

For example, comparator logic circuitry 56 may be any type of circuitry (whether hardwired or programmed), whether now known or later developed, that compares data; all such circuitry is intended to fall within the scope of the present inventions. For example, with reference to FIG. 4B, comparator logic circuitry 56 may include a plurality of EX-OR logic gates 70, which determine whether the decoded address data (here, the output of address decoder circuitry 52) "matches" data which is stored in memory 58. In response to a match, redundancy evaluation logic circuitry 72 generates the 'enable' and 'disable' signals for the redundant row and the normal row, respectively. When there is no match, the redundant word line drivers 24r remain inactive. "Integrated Circuit Device, and Method of Fabricating Same", which was filed on Jul. 2, 2004, by Fazan, Ser. No. 10/884,481 (U.S. Patent Application Publication U.S. 2005/0017240) and/or non-provisional patent application entitled "One Transistor Memory Cell having a Strained Electrically Floating Body Region, and Method of Operating Same", which was filed on Oct. 12, 2006, and assigned Ser. No. 11/580,169, by Bassin (hereinafter collectively "Integrated Circuit Device Patent Applications"). The entire contents of the Integrated Circuit Device Patent Applications, including, for example, the inventions, features, attributes, architectures, configurations, materials, techniques and advantages described and illustrated therein, are hereby incorporated by reference herein.

Further, in one embodiment, an integrated circuit device includes memory section (having a plurality of memory cells, for example, PD or FD SOI memory transistors) and logic section (having, for example, high performance transistors, such as FinFET, multiple gate transistors, and/or non-high performance transistors (for example, single gate transistors that do not possess the performance characteristics of high performance transistors—not illustrated)). Moreover, as noted above, the memory cell and/or memory cell array, as well as the circuitry of the present inventions may be implemented in an integrated circuit device having a memory portion and a logic portion (see, for example, FIG. 7A), or an integrated circuit device that is primarily a memory device (see, for example, FIG. 7B). The memory array may include a plurality of memory cells arranged in a plurality of rows and columns wherein each memory cell includes a transistor (whether fabricated in a bulk-type material or SOI material), for example, an electrically floating body transistor. The memory arrays may be comprised of N-channel, P-channel and/or both types of transistors. Indeed, In one embodiment, redundancy evaluation logic circuitry 72 may be a plurality of logic gates (for example, AND or NAND). For example, in one specific embodiment, redundancy evaluation logic circuitry 72 generates the 'enable' and 'disable' signals by logically ANDing the output of EX-OR logic gates 70 with one or more logic signals that are representative of a combination of "memory write" or "memory read" and a block select (signal that reflect the fact that the word lines of the particular memory cell array or portion of the memory cell array is being accessed).

Notably, in certain illustrations, word line drivers 24 and 24r are generally illustrated as AND gate logic. The word line drivers 24 and 24r may be any type of circuitry and/or logic, whether now known or later developed; all such circuitry is intended to fall within the scope of the present inventions.

The above embodiments of the inventions are merely exemplary. They are not intended to be exhaustive or to limit the inventions to the precise forms, techniques, materials and/or configurations disclosed. Many modifications and variations are possible in light of this disclosure. It is to be understood that other embodiments may be utilized and operational changes may be made without departing from the scope of the present inventions. As such, the scope of the inventions is not limited solely to the description above because the description of the above embodiments has been presented for the purposes of illustration and description.

It should be further noted that the term "circuit" may mean, among other things, a single component (for example, electrical/electronic and/or microelectromechanical) or a multiplicity of components (whether in integrated circuit form or otherwise), which are active and/or passive, and which are coupled together to provide or perform a desired function. The term "circuitry" may mean, among other things, a circuit (whether integrated or otherwise), a group of such circuits, one or more processors, one or more state machines, one or more processors implementing software, or a combination of one or more circuits (whether integrated or otherwise), one or more state machines, one or more processors, and/or one or more processors implementing software. The term "data" may mean, among other things, a current or voltage signal(s) whether in an analog or a digital form.

What is claimed is:

1. An integrated circuit device comprising:
a memory cell array having a plurality of memory cells arranged in a matrix of rows and columns including (i) a plurality of normal rows of memory cells which are associated with and selectable via normal row addresses and (ii) a redundant row of memory cells which is associated with and selectable via a redundant row address;
address decoder circuitry to generate decoded row address data in response to an applied row address;
normal word line drivers, coupled to the address decoder circuitry and the plurality of normal rows of memory cells, to responsively enable one or more normal rows of memory cells using the decoded row address data;
redundant word line drivers, coupled to the address decoder circuitry and the redundant row of memory cells, to responsively enable the redundant row of memory cells using the decoded row address data; and
redundancy address evaluation circuitry, coupled to the address decoder circuitry, the normal word line drivers and the redundant word line drivers, to (i) store decoded redundant row address data which corresponds to the redundant row address, and (ii) in operation, determine whether the decoded row address data corresponds to the decoded redundant row address data, and, in response thereto, enable the redundant word line drivers.

2. The integrated circuit device of claim 1 wherein the redundancy address evaluation circuitry includes a memory to temporarily store the decoded redundant row address data.

3. The integrated circuit device of claim 2 wherein the redundancy address evaluation circuitry further includes a comparator logic circuitry to compare the decoded row address data and the decoded redundant row address data which is temporarily stored in the memory and, in response to a match, to enable the redundant word line drivers and disable the normal word line drivers.

4. The integrated circuit device of claim 2 wherein the memory, in response to a control signal, stores the decoded redundant row address data provided by the address decoder circuitry.

5. The integrated circuit device of claim 2 wherein the memory, in response to a control signal, stores the decoded redundant row address data generated by the address decoder circuitry.

6. The integrated circuit device of claim 1 wherein the redundancy address evaluation circuitry includes a memory to permanently store the decoded redundant row address data.

7. The integrated circuit device of claim 6 wherein the redundancy address evaluation circuitry further includes a comparator logic circuitry to compare the decoded row address data and the decoded redundant row address data which is permanently stared in the memory and, in response to a match, to enable the redundant word line drivers and disable the normal word line drivers.

8. The integrated circuit device of claim 6 wherein the memory, in response to a control signal, stores the decoded redundant row address data provided by the address decoder circuitry.

9. The integrated circuit device of claim 6 wherein the memory, in response to a control signal, stores the decoded redundant row address data generated by the address decoder circuitry.

10. The integrated circuit device of claim 1 further including controller circuitry, coupled to the address decoder circuitry and the redundancy address evaluation circuitry, to generate (i) the redundant row address and (ii) the control signal, wherein in response thereto, the address decoder circuitry generates decoded redundant row address data and the redundancy address evaluation circuitry stores the decoded redundant row address data.

11. The integrated circuit device of claim 1 further including controller circuitry, coupled to the address decoder circuitry and the redundancy address evaluation circuitry, to determine the redundant row address and to generate (i) the redundant row address and (ii) the control signal, wherein in response thereto, the address decoder circuitry generates decoded redundant row address data and the redundancy address evaluation circuitry stores the decoded redundant row address data.

12. The integrated circuit device of claim 1 further including controller circuitry, coupled to the address decoder circuitry and the redundancy address evaluation circuitry, to determine the redundant row address based on detecting one or more bit failures or anticipated bit failures of memory cells of a row of memory cells of the plurality of normal row of memory cells.

13. The integrated circuit device of claim 12 wherein the controller circuitry generates (i) the redundant of row address and (ii) the control signal, wherein in response thereto, the address decoder circuitry generates decoded redundant row address data and the redundancy address evaluation circuitry stores the decoded redundant row address data.

14. A method of programming a redundant row of memory cells into an integrated circuit device, the integrated circuit device comprising (a) a memory cell array having a plurality of memory cells arranged in a matrix of rows and columns including (i) a plurality of normal rows of memory cells which are associated with and selectable via normal row addresses and (ii) a redundant row of memory cells which is associated with and selectable via a redundant row address, (b) address decoder circuitry to generate decoded row address data in response to an applied row address, and (c) a redundancy memory, the method comprising:

determining the redundant row address based on detecting one or more bit failures or anticipated bit failures of memory cells of a row of memory cells of the plurality of normal rows of memory cells;

generating a decoded redundant row address data by applying the redundant row address to the address decoder circuitry, wherein the decoded redundant row address data corresponds to the redundant row address;

generating a redundancy program signal; and storing the decoded redundant row address data in the redundancy memory in response to the redundancy program signal.

15. The method of claim 14 further including temporarily storing the decoded redundant row address data in the redundancy memory in response to the redundancy program signal.

16. A method of operating an integrated circuit device comprising (a) a memory cell array having a plurality of memory cells arranged in a matrix of rows and columns including (i) a plurality of normal rows of memory cells which are associated with and selectable via normal row addresses and (ii) a redundant row of memory cells which is associated with and selectable via a redundant row address, (b) address decoder circuitry to generate decoded row address data in response to an applied row address, (c) a redundancy memory to store decoded redundant row address data, (d) normal word line drivers and (a) redundant word line drivers, the method comprising:

generating the decoded row address data in response to an applied row address;

responsively enabling (i) at least one of the normal rows of memory cells or (ii) the redundant row of memory cells using the decoded row address data; and determining, during operation, whether the decoded row address data corresponds to the decoded redundant row address data stored in the redundancy memory, and, in response thereto, enabling the redundant word line drivers and disabling the normal word line drivers.

17. The method of claim 16 further including:

generating decoded redundant row address data using the address decoder circuitry, wherein the decoded redundant row address data corresponds to the redundant row address; and storing the decoded redundant row address data in the redundancy memory in response to a redundancy program signal.

18. The method of claim 16 further including:

determining the redundant row address based on detecting one or more bit failures or anticipated bit failures of memory cells of a row of memory cells of the plurality of normal rows of memory cells;

generating a decoded redundant row address data using the address decoder circuitry, wherein the decoded redundant row address data corresponds to the redundant row address;

generating a redundancy program signal; and storing the decoded redundant row address data in the redundancy memory in response to a redundancy program signal.

19. The method of claim 16 further including:

generating a decoded redundant row address data using the address decoder circuit, wherein the decoded redundant row address data corresponds to the redundant row address;

generating a redundancy program signal; and storing the decoded redundant row address data in the redundancy memory in response to a redundancy program signal.

20. The method of claim 16 further including:
generating a decoded redundant row address data using the address decoder circuitry, wherein the decoded redundant row address data which corresponds to the redundant row address ; and
storing the decoded redundant row address data in the redundancy memory.

21. the method of claim 16 further including temporarily storing the decoded redundant row address data in the redundancy memory in response to a redundancy program signal.

22. The integrated circuit device of claim 1 wherein the redundancy address evaluation circuitry includes means for (i) storing decoded redundant row address data which corresponds to the redundant row address, and (ii) in operation, determining whether the decoded row address data corresponds to the decoded redundant row address data, and, in response thereto, enable the redundant word line drivers.

\* \* \* \* \*